United States Patent [19]

Ando

[11] Patent Number: 5,182,472
[45] Date of Patent: Jan. 26, 1993

[54] LOGIC CIRCUIT WITH BIPOLAR CMOS CONFIGURATION

[75] Inventor: Koichi Ando, Tokyo, Japan
[73] Assignee: NEC Corporation, Tokyo, Japan
[21] Appl. No.: 651,802
[22] Filed: Feb. 7, 1991
[30] Foreign Application Priority Data Feb. 8, 1990 [JP] Japan ................................. 2-30136
Feb. 28, 1990 [JP] Japan ................................. 2-50014

[51] Int. Cl.⁵ .......................................... H03K 17/16
[52] U.S. Cl. .................................. 307/446; 307/570
[58] Field of Search ................................. 307/446, 570

[56] References Cited

U.S. PATENT DOCUMENTS 4,808,850 2/1989 Masuda et al. ..................... 307/446
4,829,201 5/1989 Masuda et al. ..................... 307/446
5,001,365 3/1991 Murabayashi et al. ............. 307/446

Primary Examiner—Janice A. Howell
Assistant Examiner—Scott A. Ouellette
Attorney, Agent, or Firm—Helfgott & Karas

[57] ABSTRACT

A logic circuit has a logic circuit portion which includes a first MOS transistor circuit, a second MOS transistor circuit and a third MOS transistor circuit for conducting a logical operation. The logic circuit also has a first and a second bipolar transistor for driving a next stage logic circuit and an N-channel MOS transistor for discharging the charge in the base of the second bipolar transistor. There is provided an inverter circuit whose input terminal is connected either to the output terminal or the base of the first bipolar transistor. An input to the gate of the N-channel MOS transistor is supplied from the output terminal of the inverter circuit so that, when the output changes from its high level to its low level, there is no possiblity for the first and second bipolar transistors to turn to their ON-state at the same time. Consequently, all of the current which is to be supplied from the third MOS transistor circuit to the base of the second bipolar transistor flows thereto without by-passing and, as a result, there is no reduction in the collector current of the second bipolar transistor. Thus, it is possible to have the load capacitance at the next stage discharged at a high speed and hence to have the circuit operate at a high speed.

5 Claims, 5 Drawing Sheets

LOGIC CIRCUIT WITH BIPOLAR CMOS CONFIGURATION

BACKGROUND OF THE INVENTION

The present invention relates to a logic circuit and, more particularly, to a logic circuit having a bipolar CMOS configuration in which bipolar transistors are provided at its output portion.

A logic circuit having a bipolar CMOS configuration has been known, in which bipolar transistors are provided at its output portion through which the charging and discharging of load capacitance of the next stage is conducted.

In a logic circuit having such bipolar CMOS configuration, the bipolar transistors which have larger driving capability than that of MOS transistors are used for the charging and discharging of the load capacitance of the next stage so that, in the case where the amount of the load capacitance at the next stage is large, it is possible to effect the charging and discharging at a higher speed than in a logic circuit with a simple CMOS configuration thereby enabling to achieve a high speed operation of the circuit. An example of such conventional logic circuit having a bipolar CMOS configuration is shown in FIG. 1 and the details of the arrangement thereof and the problems involved therein are fully explained later before the explanation of some preferred embodiments of the present invention.

SUMMARY OF THE INVENTION

It is, therefore, an object of the invention to overcome the problems existing in the conventional logic circuits and to provide an improved logic circuit with bipolar CMOS configuration which is capable of operating at a high speed.

According to one aspect of the present invention, there is provided a logic circuit which comprises:- a logic circuit portion having a first MOS transistor circuit of one conductivity type, a second MOS transistor circuit of an opposite conductivity type and a third MOS transistor circuit of the opposite conductivity type, for conducting a predetermined logical operation;

a first bipolar transistor having its collector connected to a first power supply terminal and its emitter connected to an output terminal for outputting an output signal based on the logical operation conducted in the logic circuit portion;

a second bipolar transistor having its collector connected to the output terminal and its emitter connected to a second power supply terminal;

a discharging MOS transistor of the opposite conductivity type having its drain connected to a base of the second bipolar transistor, the MOS transistor being for discharging the charge in the base of the second bipolar transistor; and an inverter circuit having its output connected to a gate of the MOS transistor, the inverter circuit being for applying a signal whose level is opposite to the output signal.

In one form of the invention, the inverter circuit has an input terminal for receiving as its input signal an output signal from the logic circuit itself.

In another form of the invention, the inverter circuit has an input terminal for receiving as its input signal a signal to be inputted to the base of the first bipolar transistor.

According to the present invention, it is arranged that the input applied to the gate of the N-channel MOS transistor which is provided for discharging the base charge of the second bipolar transistor is a signal inverted from the input signal supplied to the base of the first bipolar transistor or a signal inverted from the output signal of the logic circuit, so that in transition of the output signal from its high level to its low level, there is no possibility for the third MOS transistor and the N-channel MOS transistor for discharging the charge in the base of the second bipolar transistor to turn to their ON states at the same time. Consequently, all of the current which is to be supplied from the third MOS transistor circuit to the base of the second bipolar transistor flows thereto without by-passing and, as a result, there is no reduction in the collector current of the second bipolar transistor. Thus, it is possible to have the load capacitance at the next stage discharged at a high speed and hence to have the circuit operate at a high speed.

BRIEF DESCRIPTION OF THE DRAWINGS

The above and other objects, features and advantages of the present invention will be apparent from the following description of preferred embodiments according to the invention explained with reference to the accompanying drawings, in which:-

PREFERRED EMBODIMENTS OF THE INVENTION

Throughout the following explanation, similar reference symbols or numerals refer to the same or similar elements in all the figures of the drawings.

Figure 1:
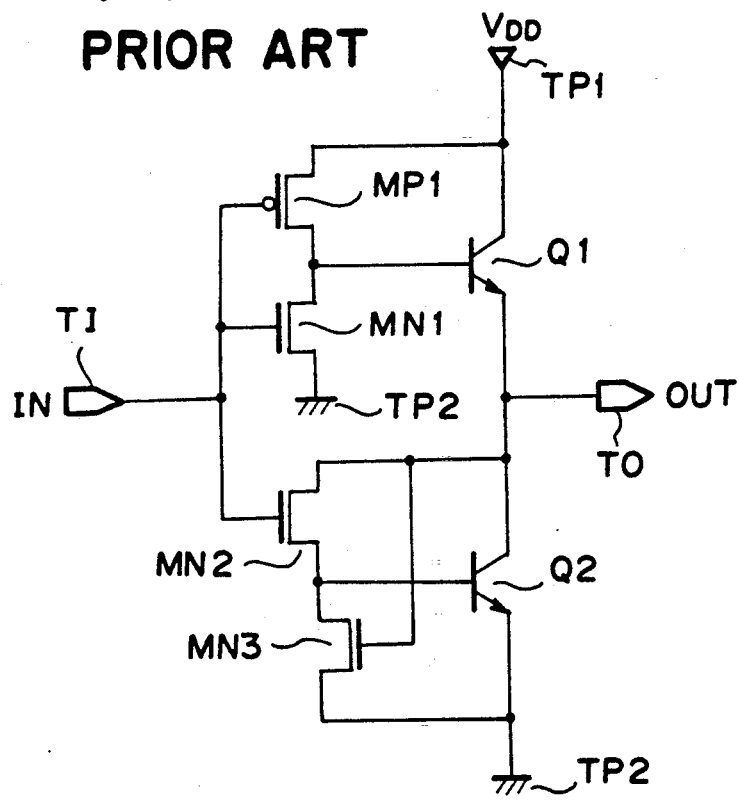
FIG. 1 is a circuit diagram showing a prior art logic circuit having a bipolar CMOS configuration.
Figure 2:
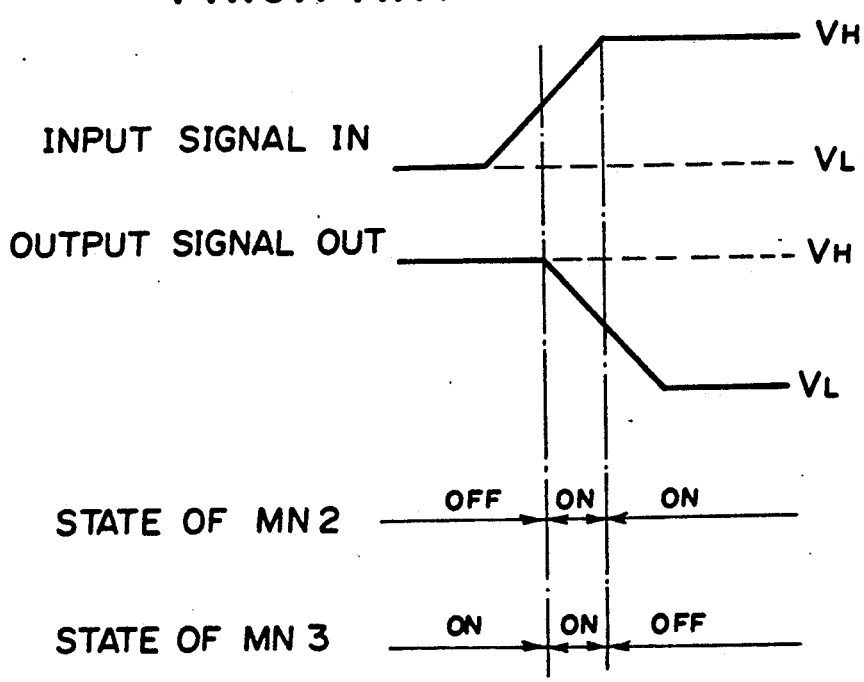
FIG. 2 is a diagram for illustrating the operation of the circuit and showing waveforms of the various signals involved in the prior art circuit shown in FIG. 1.

Firstly, for the purpose of assisting in the understanding of the present invention, a conventional logic circuit having a bipolar CMOS configuration is explained by making reference to FIGS. 1 and 2.

The logic circuit shown in FIG. 1 is a conventional totem pole type logic circuit which outputs at an output terminal TO a logic signal having an inverted relation with respect to an input signal IN applied to an input terminal TI.

This conventional logic circuit comprises a P-channel MOS transistor MP1, N-channel MOS transistors MN1-MN3 and NPN type output bipolar transistors Q1, Q2.

Generally, in a logic circuit having a bipolar CMOS configuration, the logic signal is produced through a CMOS transistor circuit and the charging and discharging of the load capacitance at the next stage is effected through an output bipolar transistor circuit. Since the charging and discharging of the load capacitance of the next stage is effected by use of bipolar transistors having a larger driving capability than that in MOS transistors, it is possible to effect the charging and discharging at a higher speed than in a MOS configuration logic circuit in the case where the load capacitance of the next stage is large and this enables the system to operate at a high speed.

Now, the operation of the above conventional logic circuit is explained.

In transition of the input signal IN from its high level $V_H$ to its low level $V_L$, the P-channel MOS transistor MP1 becomes conductive and the current is supplied to the base of the bipolar transistor Q1 through the P-channel MOS transistor MP1 from a first power supply terminal TP1 to which a higher potential power supply voltage $V_{DD}$ is supplied. The current which is several times larger than that of the base current flows from the collector to the emitter of the bipolar transistor Q1 accordingly. The load capacitance of the next stage is charged at a high speed by the increased collector current, so that the output signal OUT turns to its high level $V_H$ at a high speed.

On the other hand, in transition of the input signal IN from its low level $V_L$ to its high level $V_H$, the N-channel MOS transistor MN2 becomes conductive and the discharging current flows to the base of the bipolar transistor Q2 through the N-channel MOS transistor MN2 from the next stage load capacitance having been charged up, whereby the bipolar transistor Q2 is caused to be ON. This base current causes the collector current of the bipolar transistor Q2 to increase, so that the load capacitance of the next stage is discharged at a high speed, whereby the output signal OUT is changed from the high to the low level $V_L$ at a high speed.

Generally, even when the base potential of an NPN bipolar transistor has changed from its high level $V_H$ to its low level $V_L$, it does not become OFF momentarily because the charge in the base remains for a short period thereafter so that the ON state continues during the period in which the charge remains in the base. Therefore, in a logic circuit having a bipolar CMOS configuration, there is a possibility for both the two output bipolar transistors Q1, Q2 connected in a totem pole fashion to become ON at the same time, thereby allowing a large current (hereinafter referred to as "through current") to flow between the first and second power supply terminals TP1, TP2 resulting in a large power consumption.

Therefore, in the conventional circuit shown in FIG. 1, there is provided a means which prevents the flow of the through current in the passage from the first power supply terminal TP1 to the second power supply terminal (ground terminal) TP2 through the bipolar transistor Q1 and the bipolar transistor Q2 in case the two bipolar transistors Q1, Q2 become ON at the same time when the input signal IN changes from its low level $V_L$ to its high level $V_H$ and vice versa. Such means is as explained below.

That is, when the input signal IN changes from its low level $V_L$ to its high level $V_H$, the bipolar transistor Q2 becomes ON but the bipolar transistor Q1 becomes OFF since the N-channel MOS transistor MN1 becomes ON and the base charge of the bipolar transistor Q1 is discharged to the second power supply terminal TP2 (hereinafter referred to as "ground terminal TP2") through the N-channel MOS transistor MN1. On the contrary, when the input signal IN changes from its high level $V_H$ to its low level $V_L$, the bipolar transistor Q1 becomes ON but since the output signal OUT changes to its high level $V_H$ the N-channel MOS transistor MN3 also becomes ON and the base charge of the bipolar transistor Q2 is discharged to the ground terminal TP2 through this N-channel MOS transistor MN3, so that the bipolar transistor Q2 becomes OFF. Therefore, there is no possibility for the two bipolar transistors Q1, Q2 to become ON at the same time and there is also no possibility of the flow of such through current as described above.

In the conventional logic circuit having a bipolar CMOS configuration as explained above, when the input signal IN changes from its low level $V_L$ to its high level $V_H$, the discharging current from the load capacitance at the next stage flows to the N-channel MOS transistor MN2 and the current is supplied to the base of the bipolar transistor Q2. In order to prevent the two bipolar transistors Q1, Q2 from becoming ON at the same time, there is provided the N-channel MOS transistor MN3 which is caused to be ON or OFF in response to the level of the output signal OUT. However, as shown in FIG. 2, since there exists a period of time in which the two N-channel MOS transistors MN2, MN3 become ON at the same time, there occurs also the discharging to the ground terminal TP2 through the N-channel MOS transistor MN3. For this reason, the current supplied to the base of the bipolar transistor Q2 is reduced by the amount of current that flowed to the N-channel MOS transistor MN3.

The bipolar transistor has a feature that a large collector current can be obtained despite a small base current. What this means is that even a small reduction in the base current results in a large reduction in the collector current. Thus, in the conventional logic circuit having a bipolar CMOS configuration, the benefit of the bipolar transistor which is the charging and discharging at a high speed due to the high current amplification characteristics is not fully utilized.

The present invention provides an improved logic circuit having a bipolar CMOS configuration. A first bipolar transistor Q1 has its collector connected to a first power supply terminal TP1 to which a higher potential voltage $V_{DD}$ is supplied and its emitter connected to an output terminal TO. A second bipolar transistor Q2 has its collector connected to the output terminal TO and its emitter connected to a second power supply terminal, that is, the ground terminal TP2. A first MOS transistor circuit 1 has N (N being integer and $N \geq 1$) number of MOS transistors of one conductivity type which are provided corresponding with N number of input signals IN and are switched ON/OFF based on the corresponding input signals. This first MOS transistor circuit 1 is connected between the first power supply terminal TP1 and the base of the first bipolar transistor Q1 and it causes the current passage between the first power supply terminal TP1 and the base of the first bipolar transistor Q1 to be ON or OFF based on the result of a predetermined logical operation for the input signals IN. A second MOS transistor circuit 2 has N number of MOS transistors of an opposite conductivity type which are provided correspondingly with the N number of the input signals IN and are switched ON/OFF based on the corresponding input signals. This second MOS transistor circuit is connected between the base of the first bipolar transistor Q1 and the ground terminal TP2 and which causes the ON or OFF state opposite to the ON or OFF state between the first power supply terminal TP1 and the base of the first bipolar transistor Q1 to take place between the base of the first bipolar transistor Q1 and the ground terminal TP2. A third MOS transistor circuit 3 has N number of MOS transistors of the opposite conductivity type which are provided correspondingly with the N number of the input signals IN and are turned ON/OFF based on the corresponding input signals. This third MOS transistor circuit 3 is connected between the output terminal TO and the base of the second bipolar transistor Q2 and causes the same ON or OFF state as the ON or OFF state between the base of the first bipolar transistor Q1 and the ground terminal TP2 to take place between the output terminal TO and the base of the second bipolar transistor Q2. A MOS transistor MN3 of the opposite conductivity type is connected between the base of the second bipolar transistor Q2 and the ground terminal TP2 and causes the current passage between the base of the second bipolar transistor Q2 and the ground terminal TP2 to be ON or OFF based on a signal applied to its gate. An inverter circuit 4 has its input terminal connected to the base of the first bipolar transistor Q1 or to the output terminal of the logic circuit and its output terminal connected to the gate of the MOS transistor MN3.

The logic circuit having a bipolar CMOS configuration according to the present invention is so arranged that, in transition of the output signal from its high level to its low level, the N-channel MOS transistor MN3 which is for discharging the charge in the base of the bipolar transistor Q2 at the lower potential side does not become conductive simultaneously with the third MOS transistor circuit 3 which is connected to the base of the bipolar transistor Q2 and which is a part of the logic circuit portion for conducting logical operation. Accordingly, all of the discharging current which flows in the third MOS transistor circuit 3 from the next stage load capacitance is supplied to the base of the second bipolar transistor Q2. Therefore, in the logic circuit having a bipolar CMOS configuration according to the present invention, it is possible to utilize fully and effectively the high current amplification characteristic which is the feature of the bipolar transistor in favor of achieving a system which can operate at a high speed.

Now some preferred embodiments of the present invention are explained with reference to the appended drawings.

Figure 3:
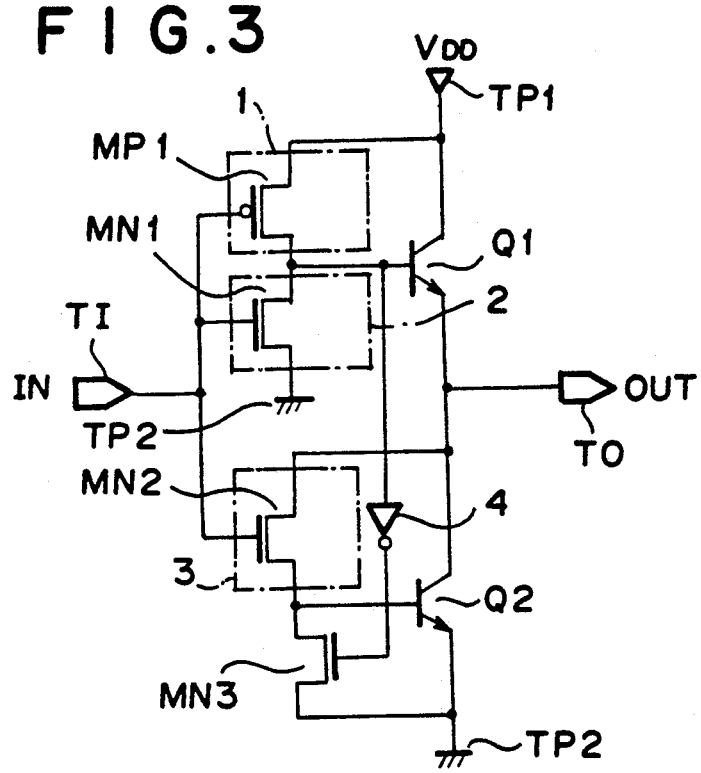
FIG. 3 is a circuit diagram showing a logic circuit of a first embodiment according to the present invention.

FIG. 3 shows a circuit diagram of a first embodiment according to the present invention in which the number N (N being integer and $N \geq 1$) of input signals is one(1) and the configuration of which generally corresponds to that of the prior art circuit shown in FIG. 1.

The difference in the first embodiment shown in FIG. 3 from the conventional arrangement shown in FIG. 1 is that a signal inputted to the base of the bipolar transistor Q1 is inputted to the gate of the N-channel MOS transistor MN3 after having been inverted by the inverter circuit 4.

The first, second and third MOS transistor circuits comprise a P-channel MOS transistor MP1, an N-channel MOS transistor MN1 and an N-channel MOS transistor MN2, respectively.

Next, the operation of the circuit according to this first embodiment is explained.

First, when the input signal IN applied to the input terminal TI changes from its high level $V_H$ to its low level $V_L$, the P-channel MOS transistor MP1 turns ON followed by the bipolar transistor Q1 turning ON thereby causing the load capacitance of the next stage to be charged and the output signal OUT at the output terminal TO to change to its high level $V_H$.

On the contrary, when the input signal IN changes from its low level $V_L$ to its high level $V_H$, the N-channel MOS transistor MN2 becomes ON followed by the bipolar transistor Q2 turning ON thereby causing the load capacitance to be discharged and the output signal OUT to change to its low level $V_L$.

Next, the operation as to how the through current is prevented is explained.

When the input signal IN changes from its low level $V_L$ to its high level $V_H$, the bipolar transistor Q2 turns to its ON state but the N-channel MOS transistor MN1 becomes ON and the base charge of the bipolar transistor Q1 is discharged. Therefore, when the bipolar transistor Q2 is in its ON state the bipolar transistor Q1 is in its OFF state.

Figure 4:
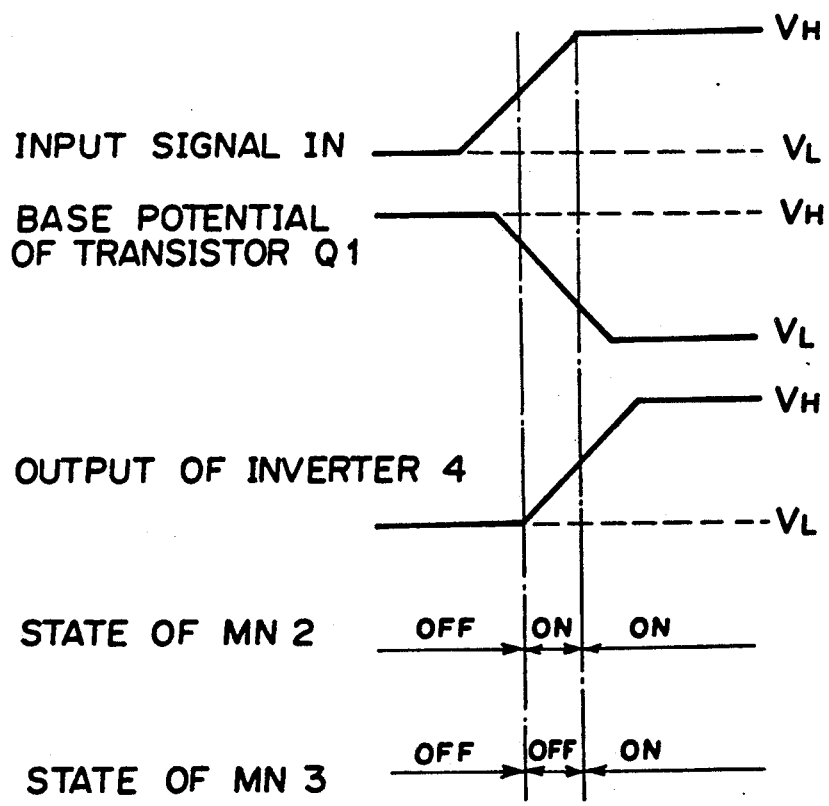
FIG. 4 is a diagram for illustrating the operation of the circuit and showing waveforms of the various signals involved in the circuit of FIG. 3.

Also, the timing when the N-channel MOS transistor MN3 which is provided to discharge the charge in the base of the bipolar transistor Q2 turns ON is, as shown in FIG. 4, subsequent to the transition of the input signal IN from its low level $V_L$ to its high level $V_H$. Therefore, at that point in time, the discharging of the base charge of the bipolar transistor Q2 has already started so that, by the time the input signal IN changes next from its high level $V_H$ to its low level $V_L$ and the bipolar transistor Q1 turns ON, the discharging of the charge in the base of the bipolar transistor Q2 has already been completed. Therefore, since the bipolar transistor Q1 is in its ON state and the bipolar transistor Q2 is in its OFF state, the two bipolar transistors Q1, Q2 never become ON at the same time and thus there is no possibility of the flow of the through current.

Also, as shown in FIG. 4, since there is no state under which the N-channel MOS transistors MN2 and MN3 become ON at the same time in transition of the input signal IN from its low level $V_L$ to its high level $V_H$, the discharging current flowed to the N-channel MOS transistor MN2 from the load capacitance of the next stage all flows to the base of the bipolar transistor Q2.

Figure 5:
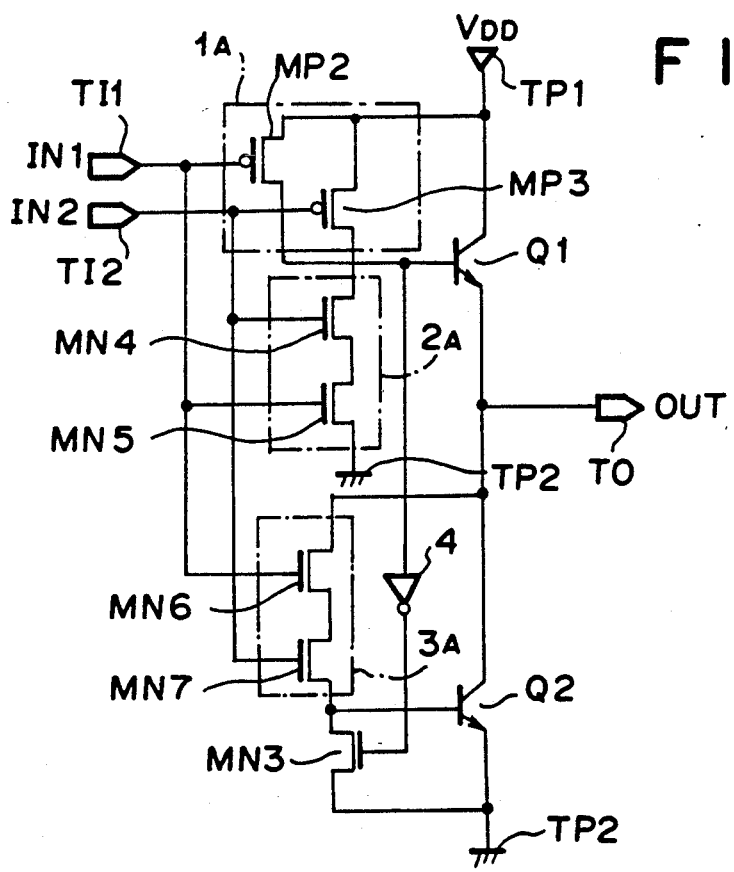
FIG. 5 is a circuit diagram showing a logic circuit of a second embodiment according to the present invention.

FIG. 5 shows in a circuit diagram a second embodiment according to the present invention. In this embodiment, the number N of inputs is two(2) and the circuit is to perform a logical NAND operation. The circuit is such that, when the values of input signals IN1, IN2 applied to input terminals TI1, TI2 are assumed to be respectively A, B and either or both of A and B are of a low level, the value A·B of an output signal OUT appearing at an output terminal TO will be of a high level and, when both A and B are of a high level, the value A·B will be of a low level.

In this logic circuit, a first MOS transistor circuit $1_A$ is formed by P-channel MOS transistors MP2, MP3 connected in parallel, a second MOS transistor circuit $2_A$ is formed by N-channel MOS transistors MN4, MN5 connected in series and a third MOS transistor circuit $3_A$ is formed by N-channel MOS transistors MN6, MN7 connected in series.

Now, the operation of the logic circuit according to this second embodiment is explained hereunder.

When one or both of the input signals IN1, IN2 are of a low level, one or both of the P-channel MOS transistors MP2, MP3 connected in parallel in the first MOS transistor circuit $1_A$ become ON, whereby the current is supplied to the base of the bipolar transistor Q1 from the power supply terminal TP1 causing the bipolar transistor Q1 to turn to its ON state. Consequently, there is an increase in the collector current of the bipolar transistor Q1 whereby the increased collector current causes the load capacitance of the next stage to be charged and the output signal OUT to be of a high level.

When both the input signals IN1, IN2 change to their high level, both the N-channel MOS transistors MN6, MN7 connected in series in the third MOS transistor circuit $3_A$ become ON, so that the discharging current flows to the base of the bipolar transistor Q2 from the load capacitance of the next stage which has been charged up, whereby the bipolar transistor Q2 turns to its ON state. Consequently, there is an increase in the collector current in the bipolar transistor Q2 and this increased collector current causes the load capacitance of the next stage to be discharged and the output signal OUT to turn to its low level.

Next, the operation as to how the through current is prevented is explained.

In the state under which the bipolar transistor Q2 becomes ON, that is, when both the input signals IN1, IN2 are in their high level, both the N-channel MOS transistors MN4, MN5 connected in series in the second MOS transistor circuit $2_A$ become ON, so that the base charge of the bipolar transistor Q1 is momentarily discharged. Consequently, when the bipolar transistor Q2 is in its ON state, the bipolar transistor Q1 is in its OFF state. Further, the input signal applied to the gate terminal of the N-channel MOS transistor MN3 which is provided for discharging the base charge of the bipolar transistor Q2 is a signal inverted from the input signal supplied to the base of the bipolar transistor Q1. Consequently, by the time the N-channel MOS transistor MN3 becomes a high level ON, both the input signals IN1, IN2 have become ON, both the N-channel MOS transistors MN4, MN5 have become ON, the base potential of the bipolar transistor Q1 has changed to its low level and the output signal of the inverter circuit 4 has changed to its high level. That is, the timing when the N-channel MOS transistor MN3 becomes ON is immediately after the input signals IN1, IN2 having changed to their high level. Therefore, by the time the bipolar transistor Q1 becomes ON again, that is, by the time one or both of the input signals IN1, IN2 change from the state of high level to that of low level, the discharging of the base charge of the bipolar transistor Q2 has already been completed. Consequently, under the state in which the bipolar transistor Q1 is in its ON state, the bipolar transistor Q2 is in its OFF state. Thus, there exists no period in which both the bipolar transistors Q1, Q2 are ON at the same time and there is no possibility of the flow of the through current.

Further, when both the input signals IN1, IN2 change to their high level, both the N-channel MOS transistors MN6, MN7 connected in series become ON. However, since the time when the N-channel MOS transistor MN3 becomes ON is after both the input signals IN1, IN2 have changed to their high level, the MOS transistor MN3 is at its OFF state during the period in which the input signals IN1, IN2 are in transition to their high level. Therefore, all of the discharging current which has flowed from the load capacitance at the next stage through the N-channel MOS transistors MN6, MN7 is supplied to the base of the bipolar transistor Q2 without by-passing to the N-channel MOS transistor MN3.

Figure 6:
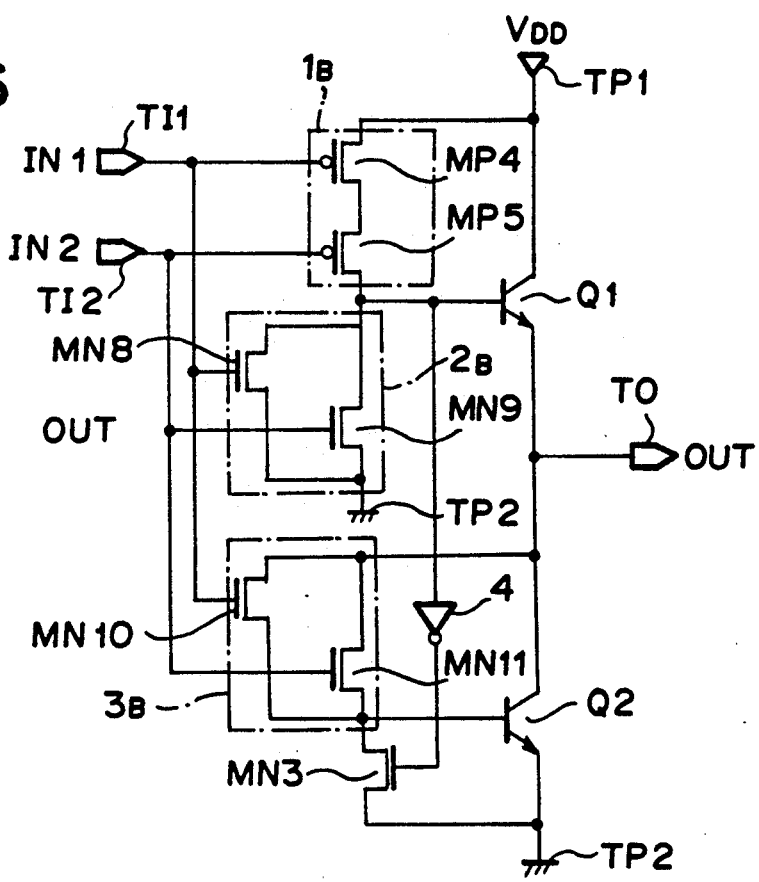
FIG. 6 is a circuit diagram showing a logic circuit of a third embodiment according to the present invention.

FIG. 6 shows in a circuit diagram a logic circuit of a third embodiment according to the present invention.

In this third embodiment, the number N of input signals is two(2) and the circuit is one which performs a logical NOR operation. In this circuit, assuming that the values of the input signals IN1, IN2 are respectively A and B and the levels of both A and B are low, the value $\overline{A+B}$ of the output signal OUT is of a high level whereas, when one or both of A and B are of a high level, the value of the output signal $\overline{A+B}$ becomes low level.

The circuit of this third embodiment comprises a first MOS transistor circuit $1_B$ formed by P-channel MOS transistors MP4, MP5 connected in series with each other, a second MOS transistor circuit $2_B$ formed by N-channel MOS transistors MN8, MN9 connected with each other in parallel and a third MOS transistor circuit $3_B$ formed by N-channel MOS transistors MN10, MN11 connected with each other in parallel.

Now, the operation of the circuit according to this embodiment is explained.

When both the input signals IN1, IN2 are of a low level, both the P-channel MOS transistors MP4, MP5 which are connected in series in the first MOS transistor circuit $1_B$ become ON whereby the current is supplied to the base of the bipolar transistor Q1 from the power supply terminal TP1 causing the bipolar transistor Q1 to turn ON. Consequently, the collector current of the bipolar transistor Q1 increases and this increased collector current causes the load capacitance at the next stage to be charged, so that the output signal OUT becomes high level.

Further, when one or both of the input signals IN1, IN2 become high level, one or both of the N-channel MOS transistors MN10, MN11 connected in parallel in the third MOS transistor circuit $3_B$ become ON, whereby the discharging current from the charged load capacitance at the next stage flows into the base of the bipolar transistor Q2 so that this bipolar transistor Q2 turns ON. Consequently, the collector current of the bipolar transistor Q2 increases and this increased collector current causes the load capacitance at the next stage to be discharged and the output signal OUT to become low level.

Next, the operation as to how the through current is prevented is explained.

In the state under which the bipolar transistor Q2 becomes ON, that is, when one or both of the input signals IN1, IN2 become high level, one or both of the N-channel MOS transistors MN8, MN9 connected in parallel in the second MOS transistor circuit $2_B$ become ON, so that the charge remaining in the base of the bipolar transistor Q1 is momentarily discharged.

Consequently, when the bipolar transistor Q2 is in its ON state, the bipolar transistor Q1 is in its OFF state.

Further, the input signal applied to the gate terminal of the N-channel MOS transistor MN3 which is provided for discharging the charge in the base of the bipolar transistor Q2 is a signal inverted from the input signal applied to the base of the bipolar transistor Q1. Consequently, by the time the N-channel MOS transistor MN3 becomes ON, one or both of the input signals IN1, IN2 have become a high level ON, one or both of the N-channel MOS transistors MN8, MN9 have become ON, the base potential of the bipolar transistor Q1 has changed to its low level and the output signal of the inverter circuit 4 has changed to its high level.

That is, the time when the N-channel MOS transistor MN3 becomes ON is immediately after one or both of the input signals IN1, IN2 have changed to their high level. Therefore, by the time the bipolar transistor Q1 becomes ON again, that is, by the time both the input signals IN1, IN2 change to their low level from the state where one or both of the input signals IN1, IN2 are in their high level, the discharging of the charge in the base of the bipolar transistor Q2 has already been completed. Consequently, under the state in which the bipolar transistor Q1 is in its ON state, the bipolar transistor Q2 is in its OFF state. Thus, there exists no period in which both the output bipolar transistors Q1, Q2 are in their ON state at the same time and there is no through current.

Further, when one or both of the input signals IN1, IN2 change to their high level from the state where both the input signals IN1, IN2 are in their low level, one or both of the N-channel MOS transistors MN10, MN11 connected in parallel become ON. However, since the timing when the N-channel MOS transistor MN3 becomes ON is after one or both of the input signals IN1, IN2 have changed to their high level, the MOS transistor MN3 is in its OFF state during the period in which one or both of the input signals IN1, IN2 are in transition to their high level. Accordingly, all of the discharging current which has flowed from the load capacitance at the next stage through one or both of the N-channel MOS transistors MN10, MN11 is supplied to the base of the bipolar transistor Q2 without by-passing through the MOS transistor MN3 to the ground terminal TP2.

Figure 7:
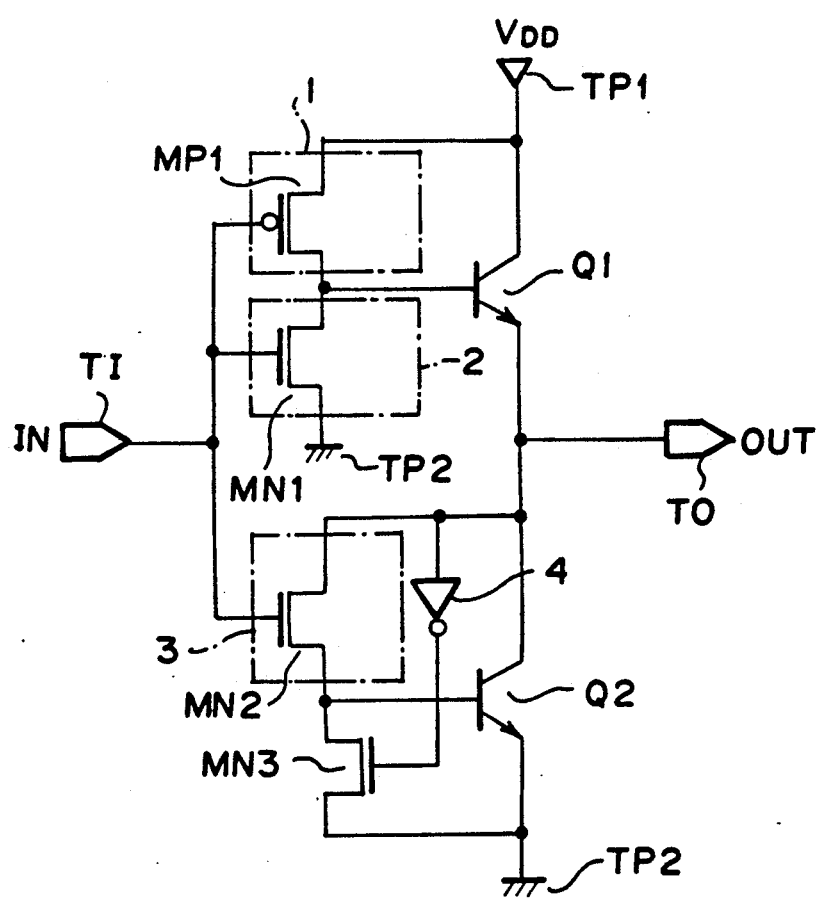
FIG. 7 is a circuit diagram showing a logic circuit of a fourth embodiment according to the present invention.

FIG. 7 shows in a circuit diagram a logic circuit of a fourth embodiment. The difference in this circuit as compared with the prior art circuit shown in FIG. 1 is that there is provided an inverter circuit 4. The inverter circuit 4 inverts the output signal OUT of the logic circuit and the signal thus inverted is inputted to the gate of the N-channel MOS transistor MN3 which prevents the through current by the discharging of the charge in the base of the second bipolar transistor Q2 at the pull-down side of the output bipolar transistor circuit. The general configuration of this circuit corresponds to the circuit of the first embodiment shown in FIG. 3 but, in the present circuit, the input terminal of the inverter circuit 4 is connected to the output terminal TO instead of the base of the bipolar transistor Q2 in FIG. 3. The explanation of the operation given for the first embodiment with reference to FIG. 3 is generally applicable to this fourth embodiment.

Figure 8:
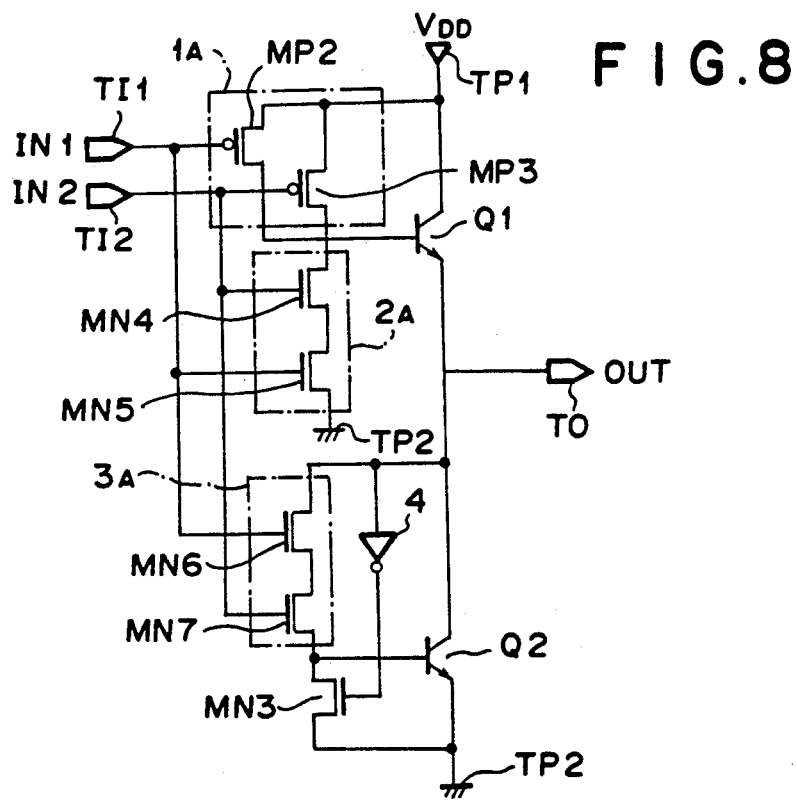
FIG. 8 is a circuit diagram showing a logic circuit of a fifth embodiment according to the present invention.

FIG. 8 shows in a circuit diagram a fifth embodiment according to the present invention. The general configuration of this circuit corresponds to the circuit of the second embodiment shown in FIG. 5 with only one difference and that is that the input terminal of the inverter circuit 4 is connected to the output terminal TO. The explanation of the operation given for the second embodiment with reference to FIG. 5 is generally applicable to this fifth embodiment.

Figure 9:
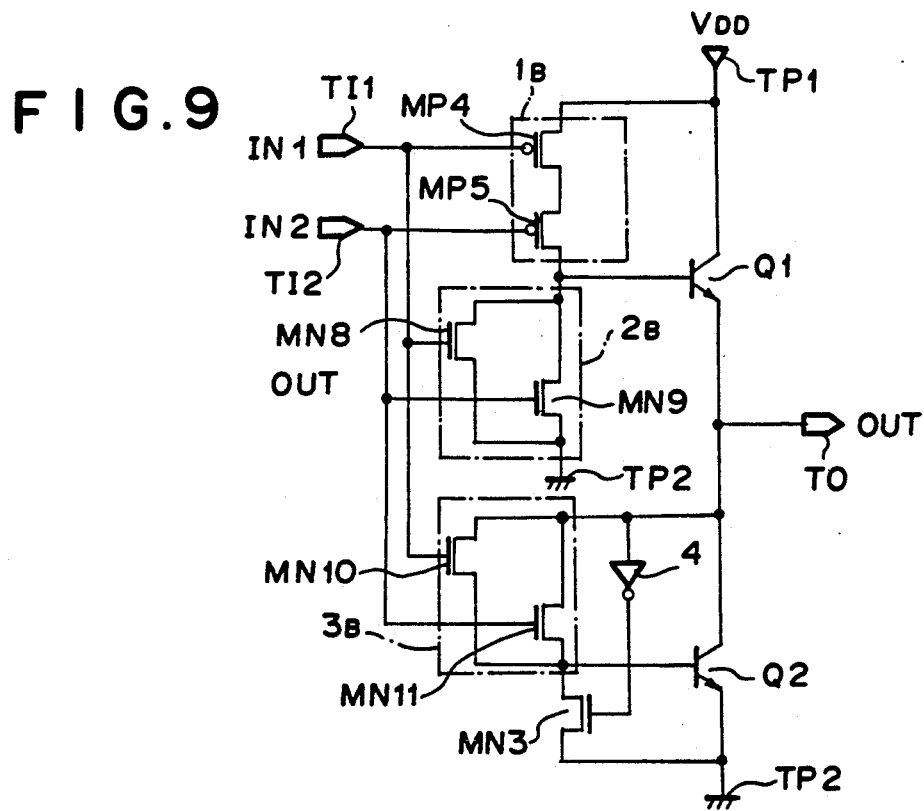
FIG. 9 is a circuit diagram showing a logic circuit of a sixth embodiment according to the present invention.

Lastly, FIG. 9 shows in a circuit diagram a sixth embodiment according to the present invention. Again, the general configuration of this circuit corresponds to the circuit of the third embodiment shown in FIG. 6 with the difference being that the input terminal of the inverter circuit 4 is connected to the output terminal TO. As to the operation, the explanation given for the third embodiment with reference to FIG. 6 is generally applicable to this sixth embodiment.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A logic circuit comprising:
   a logic circuit portion connected to an input terminal and including a first MOS transistor circuit of one conductivity type, a second MOS transistor circuit of an opposite conductivity type and a third MOS transistor circuit of said opposite conductivity type, said logic circuit portion conducting a predetermined logical operation;
   an outputting circuit portion connected to said logic circuit portion and including a first bipolar transistor having a collector connected to a first power supply terminal and an emitter connected to an output terminal for outputting an output signal based on the logical operation conducted in said logic circuit portion, and a second bipolar transistor having a collector connected to said output terminal and an emitter connected to a second power supply terminal;
   a discharging MOS transistor of said opposite conductivity type having a drain connected to a base of said second bipolar transistor, said discharging MOS transistor discharging the charge in the base of said second bipolar transistor; and
   an inverter circuit having an output connected to a gate of said discharging MOS transistor, said inverter circuit applying a signal whose level is opposite to said output signal, wherein
   said inverter circuit has an input connected to a base of said first bipolar transistor.

2. A logic circuit comprising:
   a first bipolar transistor having a collector connected to a first power supply terminal and an emitter connected to an output terminal:
   a second bipolar transistor having a collector connected to said output terminal and an emitter connected to a second power supply terminal;
   a first MOS transistor circuit which has N (N being integer and N≧1) number of MOS transistors of one conductivity type provided correspondingly with the N number of input signals for being turned ON/OFF based on the corresponding input signals, which is connected between said first power supply terminal and a base of said first bipolar transistor and which causes the ON or OFF state to take place between said first power supply terminal and the base of said first bipolar transistor based on the result of a predetermined logical operation for said input signals;
   a second MOS transistor circuit which has N number of MOS transistors of an opposite conductivity type provided correspondingly with the N number of said input signals for being turned ON/OFF based on the corresponding input signals, which is connected between the base of said first bipolar transistor and said second power supply terminal and which causes the ON or OFF state opposite to the ON or OFF state between said first power supply terminal and the base of said first bipolar transistor to take place between the base of said first bipolar transistor and said second power supply terminal;

a third MOS transistor circuit which has N number of MOS transistors of said opposite conductivity type provided correspondingly with the N number of said input signals for being turned ON/OFF based on the corresponding input signals, which is connected between said output terminal and a base of said second bipolar transistor and which causes the same ON or OFF state as the ON or OFF state between the base of said first bipolar transistor and said second power supply terminal to take place between said output terminal and the base of said second bipolar transistor;

an inverter circuit having an input connected to the base of said first bipolar transistor and inverting a signal supplied to the base of said first bipolar transistor; and a MOS transistor of said opposite conductivity type which is connected between the base of said second bipolar transistor and said second power supply terminal and which causes the ON or OFF state to take place between the base of said second bipolar transistor and said second power supply terminal based on an output signal from said inverter circuit.

3. A logic circuit comprising:

a first bipolar transistor having a collector connected to a first power supply terminal and an emitter connected to an output terminal;

a second bipolar transistor having a collector connected to said output terminal and an emitter connected to a second power supply terminal;

a first MOS transistor circuit which has N (N being integer and N≧1) number of MOS transistors of one conductivity type provided correspondingly with the N number of input signals for being turned ON/OFF based on the corresponding input signals, which is connected between said first power supply terminal and a base of said first bipolar transistor and which causes the ON or OFF state to take place between said first power supply terminal and the base of said first bipolar transistor based on the result of a predetermined logical operation for said input signals;

a second MOS transistor circuit which has N number of MOS transistors of an opposite conductivity type provided correspondingly with the N number of said input signals for being turned ON/OFF based on the corresponding input signals, which is connected between the base of said first bipolar transistor and said second power supply terminal and which causes the ON or OFF state opposite to the ON or OFF state between said first power supply terminal and the base of said first bipolar transistor to take place between the base of said first bipolar transistor and second power supply terminal;

a third MOS transistor circuit which has N number of MOS transistors of said opposite conductivity type provided correspondingly with the N number of said input signals for being turned ON/OFF based on the corresponding input signals, which is connected between said output terminal and a base of said second bipolar transistor and which causes the same ON or OFF state as the ON or OFF state between the base of said first bipolar transistor and said second power supply terminal to take place between said output terminal and the base of said second bipolar transistor;

an inverter circuit having an input connected to the base of said first bipolar transistor and inverting a signal supplied to the base of said first bipolar transistor; and a MOS transistor of said opposite conductivity type which is connected between the base of said second bipolar transistor and said second power supply terminal and which causes the ON or OFF state to take place between the base of said second bipolar transistor and said second power supply terminal based on the resultant inverted signal from said inverter circuit, wherein said first MOS transistor circuit comprises a P-channel MOS transistor, said second MOS transistor circuit comprises an N-channel MOS transistor and said third MOS transistor circuit comprises an N-channel MOS transistor.

4. A logic circuit comprising:

a first bipolar transistor having a collector connected to a first power supply terminal and an emitter connected to an output terminal;

a second bipolar transistor having a collector connected to said output terminal and an emitter connected to a second power supply terminal;

a first MOS transistor circuit which has N (N being integer and N≧1) number of MOS transistors of one conductivity type provided correspondingly with the N number of input signals for being turned ON/OFF based on the corresponding input signals, which is connected between said first power supply terminal and a base of said first bipolar transistor and which causes the ON or OFF state to take place between said first power supply terminal and the base of said first bipolar transistor based on the result of a predetermined logical operation for said input signals;

a second MOS transistor circuit which has N number of MOS transistors of an opposite conductivity type provided correspondingly with the N number of said input signals for being turned ON/OFF based on the corresponding input signals, which is connected between the base of said first bipolar transistor and said second power supply terminal and which causes the ON or OFF state opposite to the ON or OFF state between said first power supply terminal and the base of said first bipolar transistor to take place between the base of said first bipolar transistor and said second power supply terminal;

a third MOS transistor circuit which has N number of MOS transistors of said opposite conductivity type provided correspondingly with the N number of said input signals for being turned ON/OFF based on the corresponding input signals, which is connected between said output terminal and a base of said second bipolar transistor and which causes the same ON or OFF state as the ON or OFF state between the base of said first bipolar transistor and said second power supply terminal to take place between said output terminal and the base of said second bipolar transistor;

an inverter circuit having an input connected to the base of said first bipolar transistor and inverting a signal supplied to the base of said first bipolar transistor; and a MOS transistor of said opposite conductivity type which is connected between the base of said second bipolar transistor and said second power supply terminal and which causes the ON or OFF state to take place between the base of said second bipolar transistor and said second power supply terminal based on the resultant inverted signal from said inverter circuit, wherein, said first MOS transistor circuit comprises a plurality of P-channel MOS transistors connected in parallel, said second MOS transistor circuit comprises a plurality of N-channel MOS transistors connected in series and said third MOS transistor circuit comprises a plurality of N-channel MOS transistors connected in series, thereby forming a logical NAND circuit.

5. A logic circuit comprising:

a first bipolar transistor having a collector connected to a first power supply terminal and an emitter connected to an output terminal;

a second bipolar transistor having a collector connected to said output terminal and an emitter connected to a second power supply terminal;

a first MOS transistor circuit which has N (N being integer and N≧1) number of MOS transistors of one conductivity type provided correspondingly with the N number of input signals for being turned ON/OFF based on the corresponding input signals, which is connected between said first power supply terminal and a base of said first bipolar transistor and which causes the ON or OFF state to take place between said first power supply terminal and the base of said first bipolar transistor based on the result of a predetermined logical operation for said input signals;

a second MOS transistor circuit which has N number of MOS transistors of an opposite conductivity type provided correspondingly with the N number of said input signals for being turned ON/OFF based on the corresponding input signals, which is connected between the base of said first bipolar transistor and said second power supply terminal and which causes the ON or OFF state opposite to the ON or OFF state between said first power supply terminal and the base of said first bipolar transistor to take place between the base of said first bipolar transistor and said second power supply terminal;

a third MOS transistor circuit which has N number of MOS transistors of said opposite conductivity type provided correspondingly with the N number of said input signals for being turned ON/OFF based on the corresponding input signals, which is connected between said output terminal and a base of said second bipolar transistor and which causes the same ON or OFF state as the ON or OFF state between the base of said first bipolar transistor and said second power supply terminal to take place between said output terminal and the base of said second bipolar transistor;

an inverter circuit having an input connected to the base of said first bipolar transistor and inverting a signal supplied to the base of said first bipolar transistor; and a MOS transistor of said opposite conductivity type which is connected between the base of said second bipolar transistor and said second power supply terminal and which causes the ON or OFF state to take place between the base of said second bipolar transistor and said second power supply terminal based on the resultant inverted signal from said inverter circuit, wherein said first MOS transistor circuit comprises a plurality of P-channel MOS transistors connected in series, said second MOS transistor circuit comprises a plurality of N-channel MOS transistors connected in parallel and said third MOS transistor circuit comprises a plurality of N-channel MOS transistors, thereby forming a logical NOR circuit.

* * * * *